United States Patent
Geiger

(10) Patent No.: US 10,000,376 B2
(45) Date of Patent: Jun. 19, 2018

(54) METHOD FOR PRODUCING A MICRO-ELECTROMECHANICAL COMPONENT AND A MICRO-ELECTROMECHANICAL COMPONENT

(71) Applicant: NORTHROP GRUMMAN LITEF GMBH, Freiburg (DE)

(72) Inventor: Wolfram Geiger, Ebringen (DE)

(73) Assignee: Northrop Grumman LITEF GmbH (DE)

( * ) Notice: Subject to any disclaimer, the term of this patent is extended or adjusted under 35 U.S.C. 154(b) by 0 days. days.

(21) Appl. No.: 15/121,595

(22) PCT Filed: Feb. 11, 2015

(86) PCT No.: PCT/EP2015/000304
§ 371 (c)(1),
(2) Date: Aug. 25, 2016

(87) PCT Pub. No.: WO2015/128063
PCT Pub. Date: Sep. 3, 2015

(65) Prior Publication Data
US 2016/0362297 A1 Dec. 15, 2016

(30) Foreign Application Priority Data
Feb. 25, 2014 (DE) .................. 10 2014 002 825

(51) Int. Cl.
*H01L 27/14* (2006.01)
*B81C 1/00* (2006.01)
*B81B 7/00* (2006.01)

(52) U.S. Cl.
CPC ........ *B81C 1/00333* (2013.01); *B81B 7/0064* (2013.01); *B81C 1/00301* (2013.01)

(58) Field of Classification Search
CPC ...................... B81C 1/00333; B81C 7/0064
(Continued)

(56) References Cited

U.S. PATENT DOCUMENTS 6,911,392 B2 * 6/2005 Bieck ............... H01L 21/76898
257/E21.597
7,964,428 B2 6/2011 Breng et al.
(Continued)

FOREIGN PATENT DOCUMENTS

CN 101687629 A 3/2010
DE 10 2010 001 824 A1 8/2011
(Continued)

OTHER PUBLICATIONS

International Preliminary Report on Patentability for Application No. PCT/EP2015/000304.
(Continued)

*Primary Examiner* — Jami M Valentine
(74) *Attorney, Agent, or Firm* — Tarolli, Sundheim, Covell & Tummino LLP

(57) ABSTRACT

A component is produced by creating a first layer composite that includes a first electrically conductive substrate and having a trench filled with an insulating material by creating a second layer composite that includes the first layer composite and a structure layer. The structure layer includes an active structure and is electrically conductive at least in a first region that adjoins a first surface of the first substrate and includes in the first region of the first substrate a first electrically conductive contact face on a second surface of the first substrate, which is located opposite the first surface. The first region of the first substrate is electrically insulated laterally from other regions of the first substrate by the trench.

18 Claims, 10 Drawing Sheets

(58) Field of Classification Search
USPC .......................................................... 257/414
See application file for complete search history.

(56) References Cited

U.S. PATENT DOCUMENTS

| | | | |
|---|---|---|---|
| 2007/0128831 A1* | 6/2007 | Oka ...................... | B81B 3/0086 |
| | | | 438/459 |
| 2010/0218977 A1* | 9/2010 | Inoue ...................... | B32B 37/12 |
| | | | 174/250 |
| 2010/0270630 A1* | 10/2010 | Fujii ....................... | B81B 7/007 |
| | | | 257/415 |
| 2012/0223410 A1* | 9/2012 | Fujii ................. | H01L 21/76898 |
| | | | 257/507 |
| 2013/0099382 A1* | 4/2013 | Reinmuth ........... | B81C 1/00301 |
| | | | 257/770 |
| 2013/0277774 A1 | 10/2013 | Frey et al. | |
| 2013/0299924 A1 | 11/2013 | Weber et al. | |

FOREIGN PATENT DOCUMENTS

| | | |
|---|---|---|
| DE | 10 2012 210 480 A1 | 12/2013 |
| JP | 2008229833 A | 10/2008 |
| JP | 2010528888 A | 8/2010 |
| JP | 2010199507 A | 9/2010 |
| JP | 4792143 B2 | 10/2011 |
| JP | 5177015 B2 | 4/2013 |
| KR | 1020100021480 A | 2/2010 |

OTHER PUBLICATIONS

International Search Report for Application No. PCT/EP2015/000304 dated May 9, 2015.
Chinese Office Action for Application No. 201580006575.7 dated Dec. 22, 2016.
Office Action for corresponding Korean Application No. 10-2016-7023053, dated Oct. 30, 2017, with English ranslation.
Decision to Grant for corresponding Japanese application No. 2016-570170, dated Nov. 15, 2017.
Decision to Grant a Patent for an Invention for corresponding RU patent application No. 2016125157, dated Nov. 7, 2017.

* cited by examiner

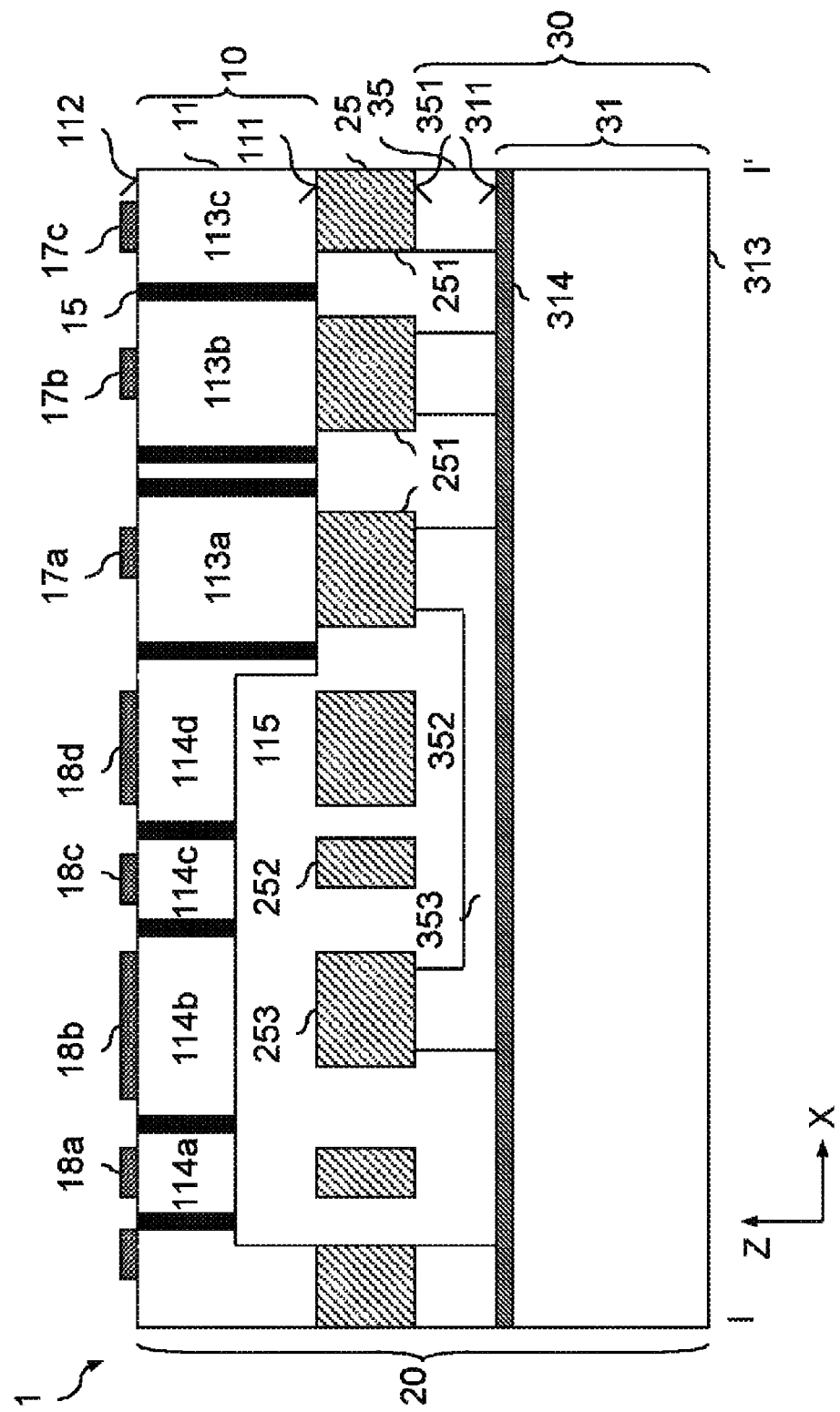

METHOD FOR PRODUCING A MICRO-ELECTROMECHANICAL COMPONENT AND A MICRO-ELECTROMECHANICAL COMPONENT

RELATED APPLICATIONS

The present invention is a U.S. National Stage under 35 USC 371 patent application, claiming priority to Serial No. PCT/EP2015/000304, filed on 11 Feb. 2015; which claims priority from DE 10 2014 002 825.9, filed 25 Feb. 2014, the entirety of both of which are incorporated herein by reference.

The invention relates to a method for producing a component, in particular, a micro-mechanical, micro-electromechanical (MEMS) or rather micro-opto-electro-mechanical (MOEMS) component, as well as to such a component.

To keep environmental impacts such as humidity and contaminations (e.g. dust) on micro-electromechanical (MEMS) components and micro-opto-electro-mechanical components (MOEMS), respectively as low as possible, active structures of such components are frequently encapsulated hermetically. In this connection, in particular, mobile structures, optical structures or structures, which equally include mobile and optical components (e.g. mobile mirrors), are to be understood by "active structure". The term "active area" designates the area or rather the volume of the component, in which the active structure lies or rather moves. The hermetically sealed encapsulation can furthermore be used to set a certain internal pressure in the region of the active structures, which is particularly advantageous for components whose functioning depends on a defined internal pressure, such as acceleration sensors and gyroscopes (rotation rate sensors), for example.

In order to be able to produce as cost-effective as possible, MEMS and MOEMS components, respectively are generally produced at the wafer level. Joining processes to be frequently conducted can be effected on the basis of direct bonding processes as well as anodic bonding processes.

Leading out electrical contacts from the hermetically sealed region of the component to contact certain parts of the component (e.g. to contact the active structure) is difficult to realize from a manufacturing point of view. Various possibilities come into consideration: The electrical contacts can, for example, be realized by lateral running semiconductor layers having a low layer resistance produced by means of implantation and diffusion processes, respectively. Furthermore, realization is possible by means of structured conductive layers covered with a planarized passivation layer.

Alternatively, the electrical contacts can be led out of the component in the form of a plurality of vertically running through connections. The contacts can each be produced via a wire, which is led through an opening or a hole in a cover of the component and connected to the part of the component to be contacted. However, in the case of large aspect ratios of the opening, i.e. in the case of large ratios of the depth of the opening to the lateral surface of the opening, difficulties regarding the realization and durability of the contact may arise. According to another possibility, a contact can be created in an opening or a hole in a cover of the component by depositing an electrically conductive layer or an electrically conductive material filling the opening. This can, in particular, in the case of high aspect ratios of the opening, result in difficulties when realizing the contact, for example, through holes in the filling or not continuously deposited layers, and require a high material expense regarding the material to be filled or additional processing steps.

Another problem can arise during the process of connecting the cover of the component to the other layers of the component. If the aforementioned openings are already existent prior to the joining process and not filled with a conductive material, then the joining area, which is available for connecting the cover to the other layers, is reduced. If the existing openings are already filled with conductive material, then restrictions for the parameters of the joining process (for example, temperature and pressure) can follow therefrom. In both cases, the quality of the connection can decrease, and the production of the hermetically sealed region of the component cannot be guaranteed.

It is therefore the object of the invention to provide a method for producing a component, in particular, a micromechanical, micro-electromechanical or micro-opto-electromechanical component, as well as such a component, by which an electrical contact to parts of the component can be realized.

The object is solved by the subject matters of the independent claims. Preferred embodiments can be found in the sub-claims.

A method for producing a component according to the present invention comprises the step of creating a first layer composite, which comprises a first substrate made of an electrically conductive material and at least one trench filled with an insulating material. The at least one trench extends outwards from a first surface of the first substrate and is arranged such that a first region of the first substrate is electrically insulated laterally from other regions of the first substrate by the at least one trench on the first surface. Furthermore, the method for producing a component comprises the step of creating a second layer composite, which comprises the first layer composite and a structure layer. The structure layer comprises an active structure of the component and is electrically conductive at least in a first region. The first region of the structure layer adjoins the first surface of the first substrate in the first region of the first substrate and is connected to the first region of the first substrate in an electrically conductive manner. Furthermore, the method for producing a component comprises the step of creating a first electrically conductive contact face on a second surface of the first substrate, wherein the second surface is located opposite the first surface, and wherein the first contact face is arranged in the first region of the first substrate. The first region of the first substrate is on the second surface of the first substrate electrically insulated laterally from other regions of the first substrate by the at least one trench. Thus, an electrical connection is realized between the first contact face on the second surface of the first substrate and the first region of the structure layer by means of the first region of the first substrate.

According to an embodiment of the method for producing a component, a first depression can be created in the first surface of the first substrate during the creation of the first layer composite, wherein the depth of the first depression is smaller than the thickness of the first substrate. The first region of the first substrate is arranged outside of the first depression. Within the first depression a second region of the first substrate can be arranged, which is electrically insulated laterally from other regions of the first substrate by the at least one trench on the first surface of the first substrate. During the creation of the second layer composite, at least a part of the active structure is arranged within the first depression at a distance to the first substrate. Furthermore, a second electrically conductive contact face is created on the second surface of the first substrate, wherein the second contact face is arranged in the second region of the first substrate, and wherein the second region of the first substrate is electrically insulated laterally from other regions of the first substrate by the at least one trench on the second surface of the first substrate.

According to an embodiment, the first layer composite comprises at least two trenches filled with insulating material, and at least two second regions of the first substrate are arranged with the first depression. At least two second contact faces are created on the second surface of the first substrate, wherein every second contact face is arranged in one of the second regions of the first substrate.

According to an embodiment, the first layer composite can comprise the first substrate and the at least one trench only, wherein the at least one trench in the first substrate extends to the second surface of the first substrate prior to creating the second layer composite.

According to another embodiment, the at least one trench in the first layer composite initially extends to a depth, which is smaller than the thickness of the first layer composite, prior to creating the second layer composite. After the creation of the second layer composite and prior to the creation of the first contact face, the thickness of the first layer composite from a first surface of the first layer composite to the depth of the at least one trench is reduced. The first surface of the first layer composite is the surface of the first layer composite, which is located opposite the first surface of the first substrate.

According to a further embodiment, the second layer composite can furthermore comprise a third layer composite, which adjoins the substrate layer on the side opposite the first layer composite and comprises a second substrate.

If the second layer composite comprises a third layer composite, then the second layer composite can, according to a first embodiment, be created in that initially the structure layer is applied to the first surface of the first substrate, and, thereafter, the structure layer applied to the first layer composite is connected to the third layer composite. According to another embodiment, the second layer composite can be created in that initially the structure layer is applied to the third layer composite, and, thereafter, the structure layer applied to the third layer composite is connected to the first layer composite.

According to an embodiment, the third layer composite can comprise a cover layer conductive at least in one region, which is arranged on a first surface of the second substrate. The first surface of the second substrate is the surface of the second substrate facing the structure layer. A second depression can be created in a first surface of the cover layer, wherein the first surface of the cover layer is the surface of the cover layer facing the structure layer. The depth of the second depression is smaller than the thickness of the cover layer. During the creation of the second layer composite, the conductive region of the cover layer is arranged in an adjoining manner to the first region of the structure layer and a second region of the structure layer. The first region of the structure layer is arranged outside of the active structure, whereas the second region of the structure layer is arranged within the active structure and is electrically conductive. The second depression and at least one part of the active structure are arranged so that the lateral position of the second depression corresponds to the lateral position of the at least one part of the active structure. The cover layer thereby forms a conductor path bridge, which connects the second region of the structure layer to the first region of the structure layer.

According to an embodiment, the structure layer and the layer of the third layer composite facing the structure layer can consist of the same material.

According to a further embodiment, the first substrate and the structure layer can consist of the same material.

In case that the layers to be connected to each other during the creation of the second layer composite, i.e. the first substrate and the structure layer, and, where applicable, the layer of the third layer composite facing the structure layer, consist of the same material, particularly suited methods for connecting those layers can be used, for example, bonding processes. For example, the layers can consist of a semiconductor material, in particular, silicon.

A component according to the present invention comprises a first layer composite, which comprises a first substrate made of an electrically conductive material and at least one trench filled with an insulating material. The at least one trench extends outwards from a first surface of the first substrate to a second surface of the first substrate, wherein the second surface of the first substrate is located opposite the first surface of the first substrate. The at least one trench is arranged such that a first region of the first substrate is electrically insulated laterally from other regions of the first substrate by the at least one trench. The component furthermore comprises a structure layer, which comprises an active structure of the component, and which is electrically conductive at least in a first region. The first region of the structure layer adjoins the first surface of the first substrate in the first region of the first substrate, wherein the first region of the structure layer is connected to the first region of the first substrate in an electrically conductive manner. The component furthermore comprises a first electrically conductive contact face on the second surface of the first substrate, wherein the first contact face is arranged in the first region of the first substrate.

According to an embodiment, a first depression is formed in the first surface of the first substrate, which has a depth smaller than the thickness of the first substrate. The first region of the first substrate is arranged outside of the first depression, while a second region of the first substrate can be arranged within the first depression, wherein the second region of the first substrate is electrically insulated laterally from other regions of the first substrate by the at least one trench. At least a part of the active structure is arranged within the first depression at a distance to the first substrate. The component furthermore comprises a second electrically conductive contact face on the second surface of the first substrate, wherein the second contact face is arranged in the second region of the first substrate.

According to an embodiment, the first layer composite comprises at least two trenches filled with insulating material. At least two second regions of the first substrate are arranged within the first depression, and at least two second contact faces are arranged on the second surface of the first substrate, wherein every second contact face is arranged in one of the second regions of the first substrate.

According to an embodiment, the component can furthermore comprise a third layer composite, which adjoins the structure layer on the side opposite the first layer composite and comprises a second substrate. The first layer composite, the structure layer, and the third layer composite can be connected to each other so that the active structure of the structure layer is closed in a hermetically sealed manner.

According to an embodiment, the third layer composite can comprise a cover layer conductive at least in one region. The cover layer is arranged on a first surface of the second substrate, wherein the first surface of the second substrate is the surface of the second substrate facing the structure layer. Furthermore, a second depression can be formed in the first surface of the cover layer, wherein the first surface of the cover layer is the surface of the cover layer facing the structure layer, and wherein the depth of the second depression is smaller than the thickness of the cover layer. The conductive region of the cover layer adjoins the first region of the structure layer and a second region of the structure layer, wherein the first region of the structure layer is arranged outside of the active structure, and the second region of the structure layer is arranged within the active structure and is electrically conductive. The first depression and at least one part of the active structure are arranged so that the lateral position of the second depression corresponds to the lateral position of the at least one part of the active structure. Thus, the cover layer forms a conductor path bridge, which connects the second region of the structure layer to the first region of the structure layer.

According to an embodiment, the structure layer and the layer of the third layer composite facing the structure layer can consist of the same material.

According to a further embodiment, the first substrate and the structure layer can consist of the same material.

Embodiments of the present invention are explained in more detail in the following text based on the figures, with similar elements being designated with identical reference numerals.

FIG. 2 shows a schematic representation of a component according to a further embodiment of the invention in cross section along a line I-I'.

Figure 1A:
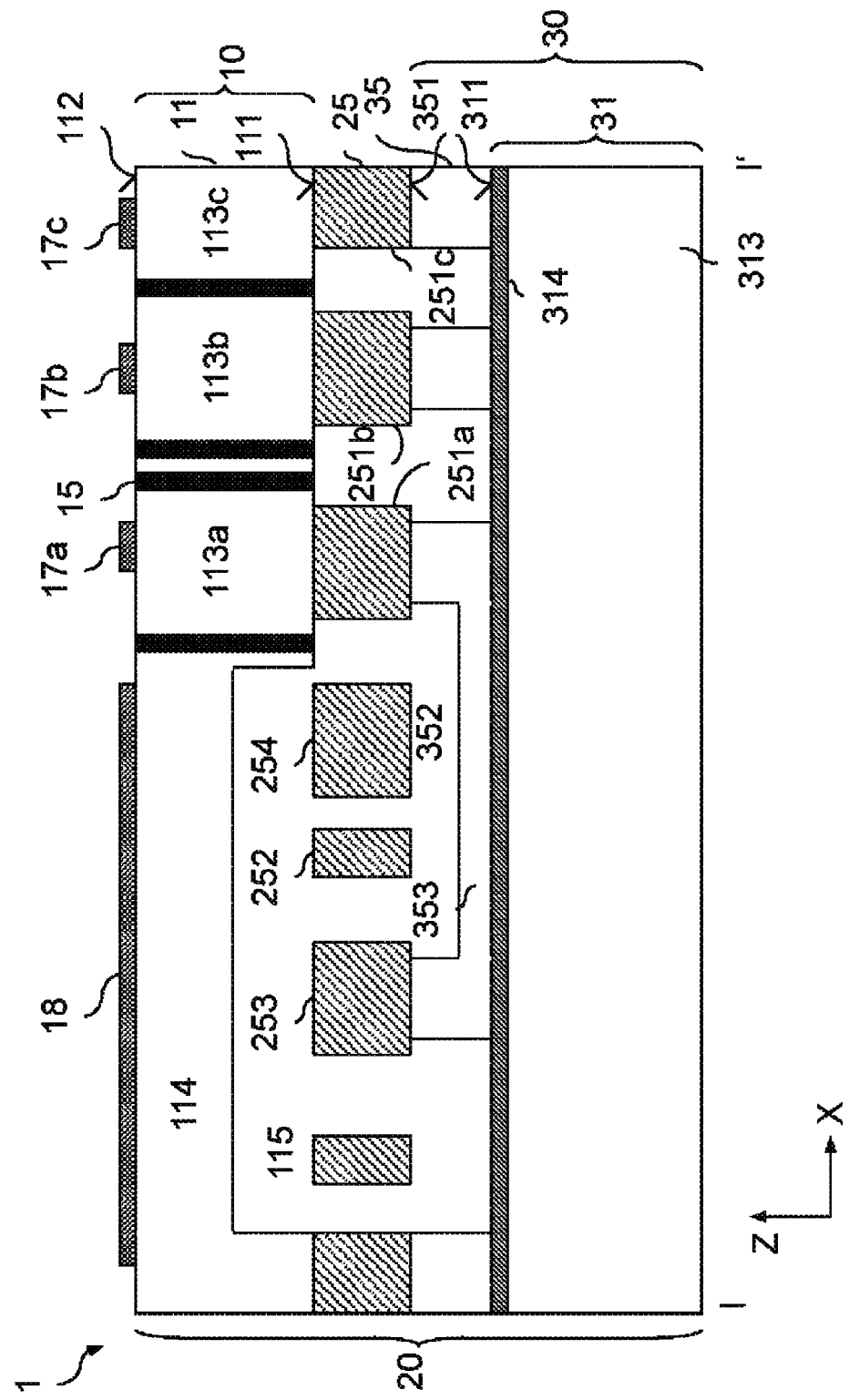
FIG. 1A shows a schematic representation of a component according to an embodiment of the invention in cross section along a line I-I' of FIG. 1B.
Figure 1B:
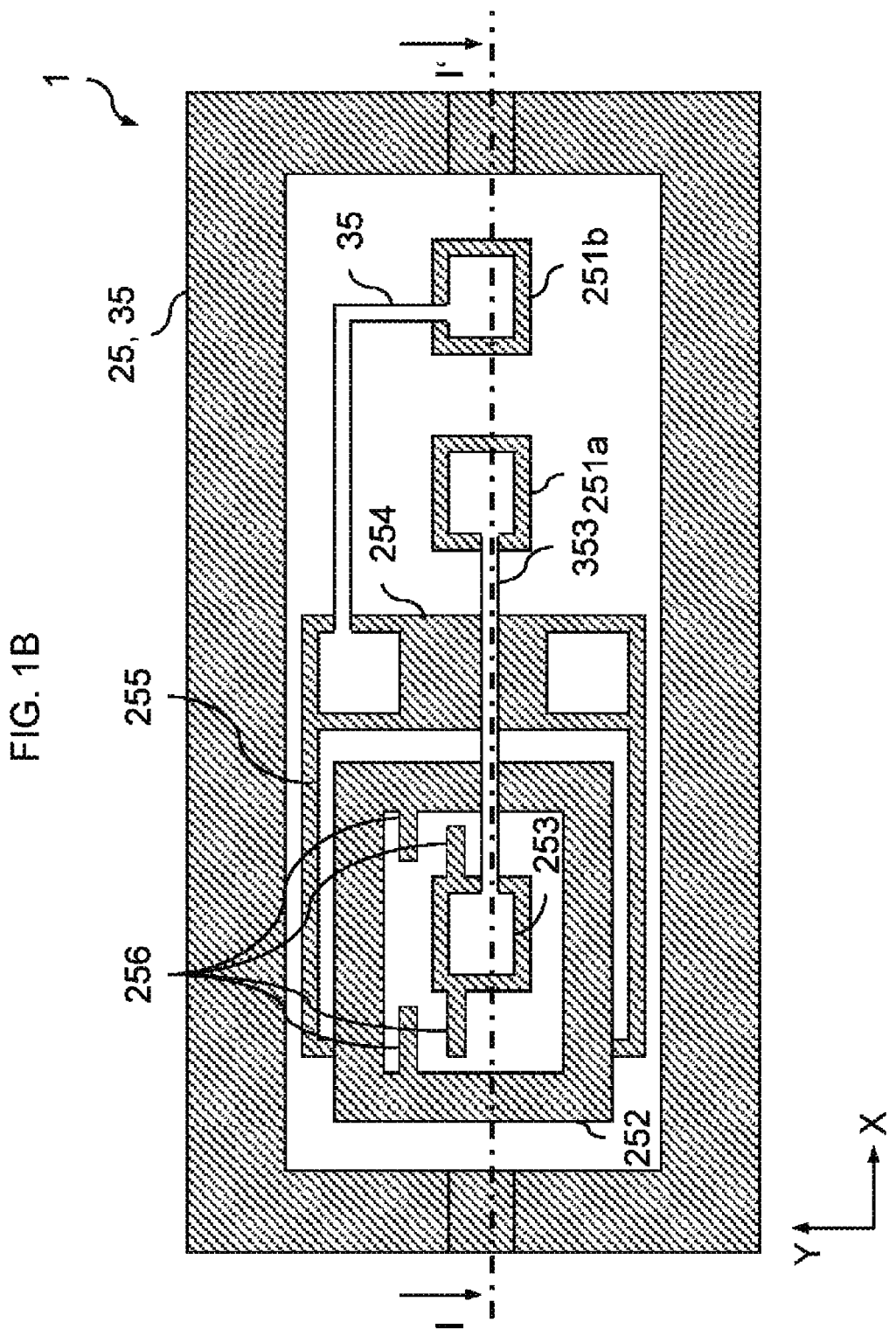
FIG. 1B shows a schematic representation of two layers of the component according to an embodiment of the invention in the top view.

FIG. 1A shows a cross section through a component according to the invention according to a first embodiment along a line I-I', while FIG. 1B shows a top view of two layers of the component. The component 1 illustrated in FIG. 1A comprises a first layer composite 10, a structure layer 25, a third layer composite 30 as well as first contact faces 17a to 17c and a second contact face 18. The first layer composite 10, the structure layer 25, and the third layer composite 30 together form the second layer composite 20.

The first layer composite 10 comprises a first substrate 11 having a first surface 111 and a second surface 112, which is located opposite the first surface 111 of the first substrate 11. In this connection, the term "substrate" describes formations consisting of one material only, for example, a silicon wafer, which, however, can also include a composite made of a plurality of layers and materials, as long as the first substrate 11 is electrically conductive.

The first substrate 11 has at least a first region 113, which is electrically insulated from other regions of the first substrate 11 by a trench 15. In FIG. 1A, three first regions 13a, 113b and 113c are illustrated. Further regions of the first substrate 11 can be arranged between specific trenches 15, which electrically insulate various first regions 113. This is illustrated in FIG. 1A for the first regions 113a and 113b. However, the very same trench 15 can also adjoin two first regions, as illustrated in FIG. 1A for the first regions 113b and 113c. The trenches 15 are filled with insulating material and extend from the first surface 111 of the first substrate 11 to the second surface 112 of the first substrate 11. The trenches 15 are arranged such that a trench 15 each insulates a first region 113 completely from other regions of the first substrate 11. In the top view, the trenches 15 can be arranged arbitrarily, as long as every specific trench 15 completely insulates a specific first region 113. The specific first region 113 insulated by a specific trench 15 can have any form in the top view. The insulated first region 113 can, for example, have a round form, a rectangular form, a hexagonal form, or any other form in the top view. The trenches 15 can—in cross section—extend arbitrarily from the first surface 111 to the second surface 112. This means, the trenches 15 can run in a straight or curved line perpendicular to the surfaces 111 and 112 or at defined angles to those surfaces, as long as they extend continuously.

In the first substrate 11 a first depression 115 can be formed, which extends outwards from the first surface 111, wherein the depth of the first depression 115 is smaller than the thickness of the first substrate 11. Within the first depression 115 a second region 114 of the first substrate 11 is formed, which is electrically insulated laterally from other regions of the first substrate 11 by at least one of the trenches 15. The second region 114 of the first substrate 11 can also extend laterally beyond the first depression 115. This means that the second region 114 can be connected to regions of the first substrate 11 outside of the first depression 115 both physically and electrically. In the case illustrated in FIGS. 1A and 1B, the second region 114 is electrically insulated from the first regions 113a to 113c.

The structure layer 25 comprises first regions 251a to 251c, an active structure 252, a second region 253, and a third region 254. The first regions 251a to 251c are arranged outside of the active structure 252, while the second region 253 is arranged within the active structure 252. The design of the structure layer is to be explained in more detail based on FIG. 1B.

FIG. 1B shows the structure layer 25 of a micro-mechanical component 1, which has an active structure 252, in an exemplary embodiment. The active structure 252 is connected to the third region 254 of the structure layer via a spring 255, and can move in all directions within the scope of mobility of the spring 255. The first regions 251a to 251c as well as the second region 253 and the third region 254 of the structure layer 25 are firmly connected to other layers of the component 1 and cannot move. The active structure 252 forms a closed framework, within which the second region 253 of the structure layer is arranged. Via electrodes 256, which are mounted on the active structure 252 and the second region 253, the movement of the active structure can be detected. The structure layer 25 can consist of a conductive material, for example, of doped silicon or another semiconductor material. In this case, the individual regions of the structure layer 25 are physically separated from each other. However, the structure layer 25 can also consist of a material, which is electrically conductive in certain regions only. These regions, for example, can be doped semiconductor regions, which are electrically insulated from each other via undoped semiconductor regions or insulating regions. Then individual regions of the structure layer 25 can also be physically connected to each other.

FIG. 1B furthermore shows a cover layer 35, which is explained in more detail later.

As can be obtained from FIG. 1A, the first regions 251*a* to 251*c* of the structure layer 25 adjoin the first surface 111 of the first substrate 11 in the first regions 113 of the first substrate 11. Thus, the first regions 251*a* to 251*c* of the structure layer 25 are connected to the first regions 113 of the first substrate 11 in an electrically conductive manner. The active structure 252 is arranged within the first depression 115 of the first substrate 11 at a distance to the first substrate 11. It can thus move freely in a direction perpendicular to the first surface 111 of the first substrate 11, i.e. in z-direction.

The component 1 furthermore has a third layer composite 30. The third layer composite 30 can comprise a second substrate 31. Also in this connection, the term "substrate" describes structures which consist of one material only, for example, a silicon wafer or a glass plate, which, however, can also include a composite of a plurality of layers and materials. A second substrate 31, which comprises a first layer 313 and a second layer 314, is illustrated in FIG. 1A. The layers can differ from each other in respect of material and of their conductivity. For example, the first layer 313 can consist of an at least partially electrically conductive material, for example, silicon, while the second layer 314, for example, can be a layer made of an insulating material, for example, silicon oxide. However, also the first layer 313 can be made of an insulating material, for example, and the second layer 314 can be a layer, which is conductive in certain regions only, or the second layer 314 can even not exist at all. The second substrate 31, also, can only consist of one or more electrically insulating materials.

The third layer composite 30 can furthermore comprise a cover layer 35, which is arranged on a first surface 311 of the second substrate 31. The first surface 311 of the second substrate 31 is the surface of the second substrate 31 facing the structure layer 25. The cover layer 35 can consist of a material electrically conductive at least in one region, and can serve for electrical connection between different regions of the structure layer 25. Thus, the cover layer 35 can consist of a structured layer made of an electrically conductive material, wherein individual regions of the cover layer 35 are physically separated from each other. However, also only individual electrically conductive regions can be formed in the cover layer 35, which not necessarily must be physically separated from each other. The cover layer 35, for example, can consist of a semiconductor material, in particular, of silicon. A first surface 351 of the cover layer 35 adjoins the structure layer 25 at least in specific regions. For example, the surface 351 of the cover layer 35 adjoins the first regions 251*a* to 251*c* and the second region 253 of the structure layer 25. The cover layer 35 can have a second depression 352, which extends outwards from the first surface 351 of the cover layer 35 and has a depth which is smaller than the thickness of the cover layer 35. Thus, with the aid of the cover layer 35 thinned in the first depression 352, a conductor path bridge 353 can be realized, which, for example, connects the first region 251*a* of the structure layer 25 to the second region 253 of the structure layer 25 in an electrically conductive manner, wherein the active structure 252 of the structure layer 25 is bridged.

The first layer composite 10, the structure layer 25, and the third layer composite 30 together form the second layer composite 20, wherein individual parts of the third layer composite 30 or the entire layer composite 30 are optional. If the third layer composite 30 exists, then the active structure 252 can be encapsulated in a hermetically sealed manner via the connection of the first layer composite 10, the structure layer 25, and the third layer composite 30.

The component 1 furthermore comprises first contact faces 17*a* to 17*c* as well as a second contact face 18. The contact faces 17*a* to 17*c* and 18 are made of a conductive material, for example metal, and are arranged on the second surface 112 of the first substrate 11. Every first contact face 17*a* to 17*c* is arranged in a first region 113*a* to 113*c* of the first substrate, while the second contact face 18 is arranged in the second region 114 of the first substrate 11. The first contact faces 17*a* to 17*c* serve for contacting the first regions 251*a* to 251*c* of the structure layer 25, wherein an electrical connection is realized via the first regions 113*a* to 113*c* of the first substrate 11. The second contact face 18 serves as a shield of the active region of the component 1 from external electrical fields, and can serve for providing a defined potential above the active structure 252. In the embodiment illustrated herein, the regions of the structure layer 25, which adjoin the first region 113*c* and the second region 114, are physically connected to each other, as can be seen from FIG. 1B. If the corresponding regions of the structure layer 25 are also connected to each other in an electrically conductive manner, the first contact face 17*c* can also be saved.

FIG. 2 shows a schematic representation of the component 1 according to a further embodiment, wherein that embodiment differs from the embodiment illustrated in FIG. 1A in that a plurality of second regions 114*a* to 114*d* are formed in the first substrate 11 within the first depression 115. The second regions 114*a* to 114*d* are each electrically insulated from the adjoining regions of the first substrate 11 via trenches 15 filled with insulating material. The trenches 15 correspond to the trenches 15 described in FIG. 1A, which electrically insulate the various first regions 113*a* to 113*c* from other regions of the first substrate 11, and can be formed equal or different to those with regard to form and insulating material.

In every second region 114*a* to 114*d* a corresponding second contact face 18*a* to 18*d* is arranged on the second surface 112 of the first substrate 11. For this reason, it is possible to assign different potentials to different regions 114*a* to 114*c* of the first substrate 11 above the active area. For example, a potential can be applied in the second regions 114*a* and 114*c* located above the active structure 252, which restricts the movement of the active structure 252 in z-direction, and, thus, prevents the active structure 252 from abutting on the first substrate 11. In contrast, the second regions 114*b* and 114*d* can be kept at other potentials, which are merely meant to serve to shield the structure layer 25 from external electrical fields.

Figure 3A:
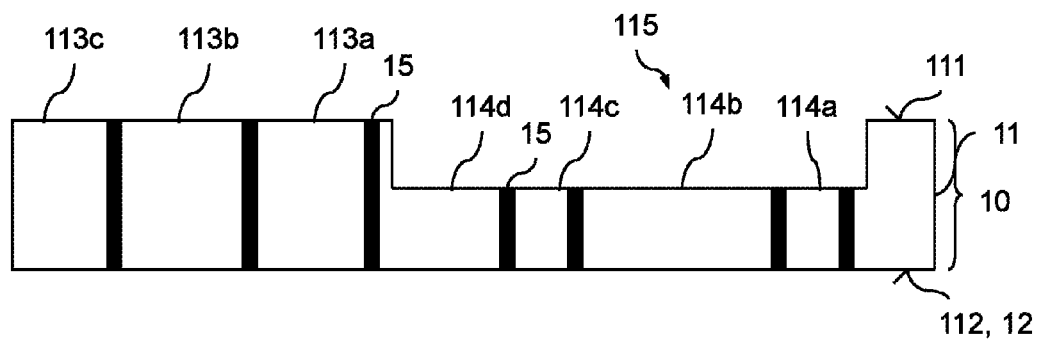
FIGS. 3A to 3C show steps of a first embodiment of the method according to the invention based on cross sections.
Figure 3B:
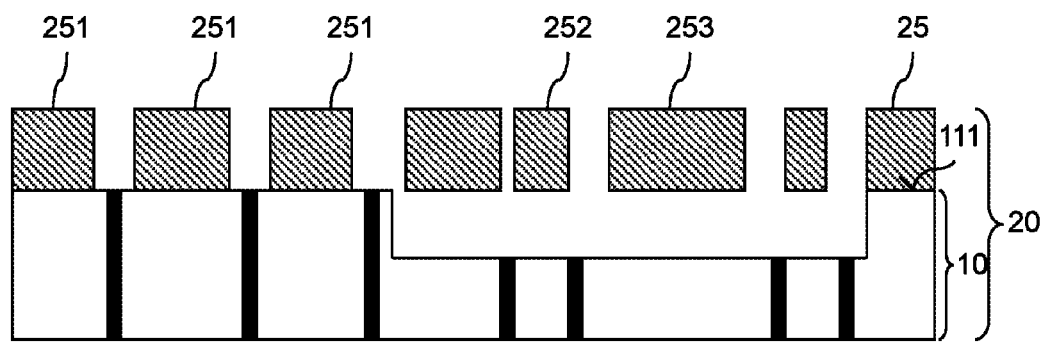
Figure 3C:
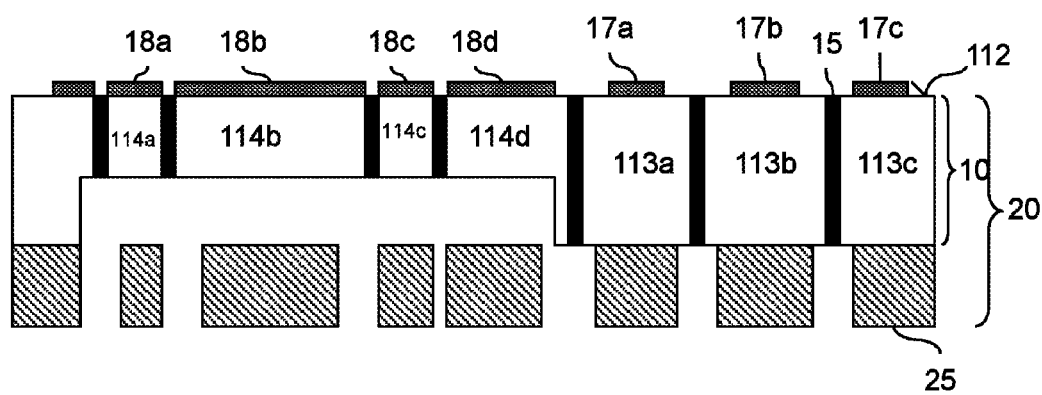

Based on FIGS. 3A to 3C, a first embodiment of the method for producing a component according to the invention is described based on cross-sectional views.

As illustrated in FIG. 3A as a result, firstly a first layer composite 10 is created, which comprises a first substrate 11 and at least one trench 15 filled with insulating material. The trenches 15 can be created with the aid of an etching process, for example, a dry etching process (DRIE) or a strongly anisotropic wet etching process using a mask, or with the aid of other processes as well as a subsequent filling process of the trenches emerged with an insulating material. The trenches 15 are created from the first surface 111 of the first substrate 11 and can extend to the first surface 12 of the first layer composite 10. If the first layer composite 10, as illustrated in FIG. 3A, only consists of the first substrate 11, then the second surface 112 of the first substrate 11 is the first surface 12 of the first layer composite 10. In this case, the trenches 15 can also be created starting from the first surface 111 and the second surface 112 of the first substrate 11, which can be advantageous for very thick first substrates 11, in particular. The insulating material, by which the trenches 15 are filled, can, for example, be filled into the trenches 15 with the aid of a chemical or physical vapor deposition (CVD and PVD, respectively) method. Subsequently to the filling of the trenches 15 with the insulating material, excessive insulating material located on the first surface 111 and, where applicable, on the second surface 112 of the first substrate 11 is removed again. This can be conducted with the aid of a chemo-mechanical polishing process (CMP) or with the aid of an etching process.

FIG. 3A illustrates the case that the trenches 15 extend continuously from the first surface 111 to the second surface 112 of the first substrate 11. Thus, the trenches 15 electrically insulate first regions 113a to 113c of the first substrate 11 from other regions of the first substrate.

According to an embodiment, a first depression 115 can be formed in the first surface 111 of the first substrate 11, whose depth is smaller than the thickness of the first substrate 11. This means, the first depression 115 does not extend to the second surface 112 of the first substrate 11. As illustrated in FIG. 3A, also trenches 15 filled with insulating material can be formed within the first depression 115, which electrically insulate the second regions 114a to 114d of the first substrate 11 from other regions of the first substrate 11. The trenches 15 in the first depression 115 can be created simultaneously with the trenches 15 outside of the first depression 115 or in a separate process step. The trenches 15 can be created prior to creating the first depression 115 or thereafter.

The first layer composite 10 can initially consist of the first substrate 11 and of another layer, an auxiliary layer, adjoining the second surface 112 of the first substrate 11. The first substrate 11 consists of an electrically conductive material, for example of a semiconductor material and, in particular, of silicon. The mentioned auxiliary layer can consist of an insulating material, for example, silicon oxide, which, however, is removed again after the formation and filling of the trenches 15, so that, as a result of the first step of creating the first layer composite 10, the trenches 15 extend from the first surface 111 of the first substrate 11 to the second surface 112 of the first substrate 11, and the first layer composite 10 only has the first substrate 11 and no other layers arranged thereon, as illustrated in FIG. 3A.

In addition, the mentioned auxiliary layer can also be part of the first substrate 11. This means that the trenches 15 are initially not created continuously to the second surface 112 of the first substrate 11, but have a depth smaller than the thickness of the first substrate 11. However, according to the embodiment of the method illustrated in FIG. 3A, the first substrate 11 is thinned from the second surface 112 of the first substrate 11 to the depth of the trenches 15, so that the trenches 15 adjoin the second surface 112 of the first substrate 11. Thus, the embodiment of the first layer composite 10 illustrated in FIG. 3A exists prior to the creation of the second layer composite 20.

In a second step illustrated in FIG. 3B a second layer composite 20 is created, which comprises the first layer composite 10 as well as a structure layer 25, in which an active structure 252 and first regions 251 are formed. The structure layer 25 is electrically conductive at least in the first regions 251. The second layer composite 20 can be created by applying the structure layer 25 to the first layer composite 10, or by connecting the structure layer 25 to the first layer composite 10. The structure layer 25 can initially, as an unstructured layer, be applied to the first surface 111 of the first substrate 11 or connected thereto and structured thereafter, in order to create the active structure 252. This can, for example, be realized by an etching process, in which also the first regions 251 can be created. However, the first regions 251 can also be formed as electrically conductive regions insulated from each other within the structure layer 25, for example, by means of doping processes in a semiconductor layer, wherein the individual first regions 251 need not necessarily be physically separated from each other.

The structure layer 25 can be applied to the surface 111 of the first substrate 11 with the aid of a deposition process, for example, using an auxiliary layer, which firstly fills the first depression 115, and is selectively removed again after the deposition and structuring of the structure layer 25. However, the structure layer 25 can also be connected to the surface 111 of the first substrate 11 as an unstructured layer or as an already structured layer with the aid of a joining process, for example, silicon direct bonding (SDB), anodic bonding or other methods. This lends itself particularly, when a hermetically sealed encapsulation of an active area mentioned at the beginning is to be achieved. For a joining process it can be particularly advantageous, if the layers to be connected, in this case the first substrate 11 and the structure layer 25, consist of the same material.

In a further step of the first embodiment of the method according to the invention, first contact faces 17a to 17c are created on the second surface 112 of the first substrate 11 in the first regions 113a to 113c of the first substrate 11. In addition, second contact faces 18a to 18d can be created on the second surface 112 of the first substrate 11 in the second regions 114a to 114d of the first substrate 11. The first contact faces 17a to 17c and the second contact faces 18a to 18d can consist of the very same material or of different electrically conductive materials, and can be created in one or in different process steps. For example, a metallic layer can be applied to the second surface 112 of the first substrate 11 and subsequently be structured by means of an etching process or a lift-off process, so that the first contact faces 17a to 17c and the second contact faces 18a to 18d emerge.

FIGS. 4A to 4D show various process steps of a second embodiment of the method for producing a component according to the invention.

Figure 4A:
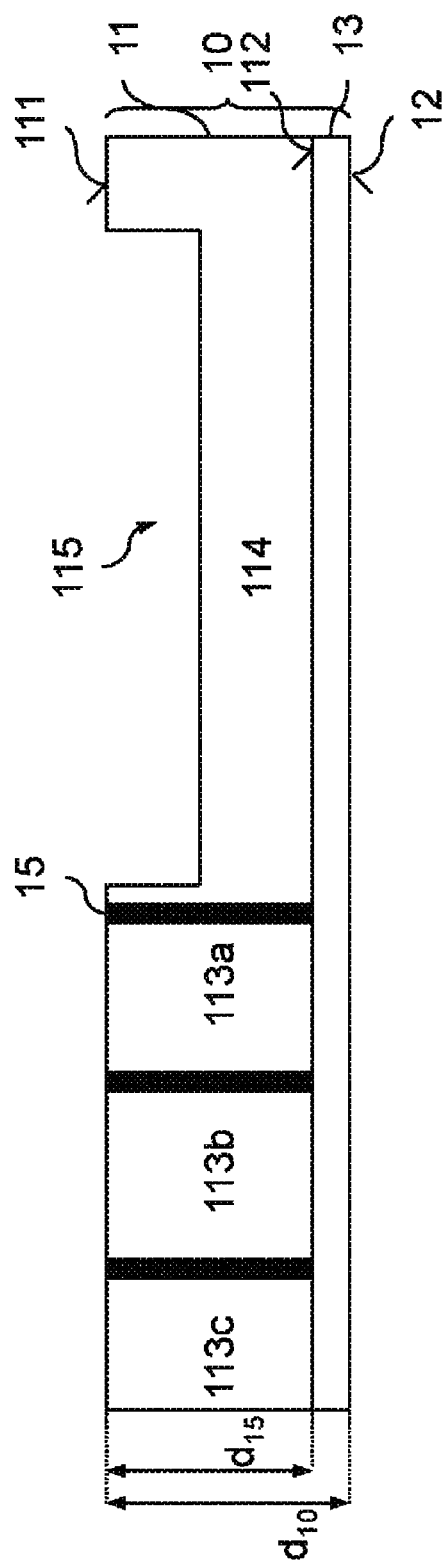
FIGS. 4A to 4D show steps of a second embodiment of the method according to the invention based on cross sections.

At first, a first layer composite 10 is created in a first process step, which comprises a first substrate 11 and at least one trench 11 formed in the first substrate 11 and filled with an insulating material, wherein the at least one trench 15 extends outwards from the first surface 111 of the first substrate 11. As illustrated in FIG. 4A, the trench(es) 15, however, do not extend to the first surface 12 of the first layer composite 10, which is located opposite the first surface 111 of the first substrate 11. This means, the depth $d_{15}$ of the trenches 15 is smaller than the thickness $d_{10}$ of the first layer composite 10. As already described with reference to FIG. 3A, the first layer composite 10 can, in addition to the first substrate 11, comprise an auxiliary layer 13, which adjoins the second surface 112 of the first substrate 11 and in which no trenches 15 are formed. Alternatively, the first layer composite 10 can comprise the first substrate 11 only, whereas, however, the trenches 15 do not extend to the second surface 112 of the first substrate 11. In other words: the auxiliary layer 13 illustrated in FIG. 4A can be a part of the first substrate 11. However, in contrast to the first embodiment of the method described with reference to FIG. 3A, the auxiliary layer 13 is initially preserved, i.e. it is not removed prior to creating the second layer composite 20.

As illustrated in FIG. 4A, a first depression 115 can be formed in the first surface 111 of the first substrate 11, within which a second region 114 of the first substrate is arranged. In addition, as illustrated in FIG. 3A, the trenches 15 can also be formed in a region of the substrate 11, which adjoins the first depression 115, so that a plurality of second regions 114, as illustrated in FIG. 3A, is created. As a result of the first process step of the second embodiment of the method, the first layer composite 10 illustrated in FIG. 4A exists.

Figure 4B:
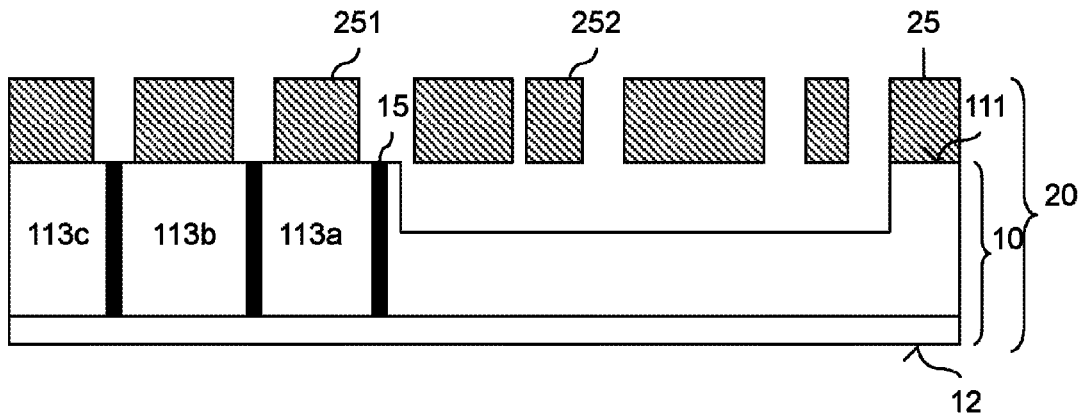

Subsequently, a second layer composite 20 is created in a further process step, by applying a structure layer 25 to the first surface 111 of the first substrate 11 and connected to the first surface 111 of the first substrate 11. The result is illustrated in FIG. 4B. This corresponds to the process step described with reference to FIG. 3B, wherein, however, the trenches 15 do not extend to the first surface 12 of the first layer composite 10 prior to the creation of the second layer composite 20. This embodiment of the method has the advantage over the first embodiment of the method that the first layer composite 10 has a higher stability during the creation of the second layer composite 20, since the individual lateral regions of the layer composite 10, for example, the regions 113a to 113c, are still connected to each other via the auxiliary layer 13. Thus, process parameters can be used, in particular, for a joining process to connect the structure layer 25 to the first surface 111 of the first substrate 11, which result in a more stable and tighter connection between the structure layer 25 and the first substrate 11. An example therefore are higher pressures in a bonding process.

Figure 4C:
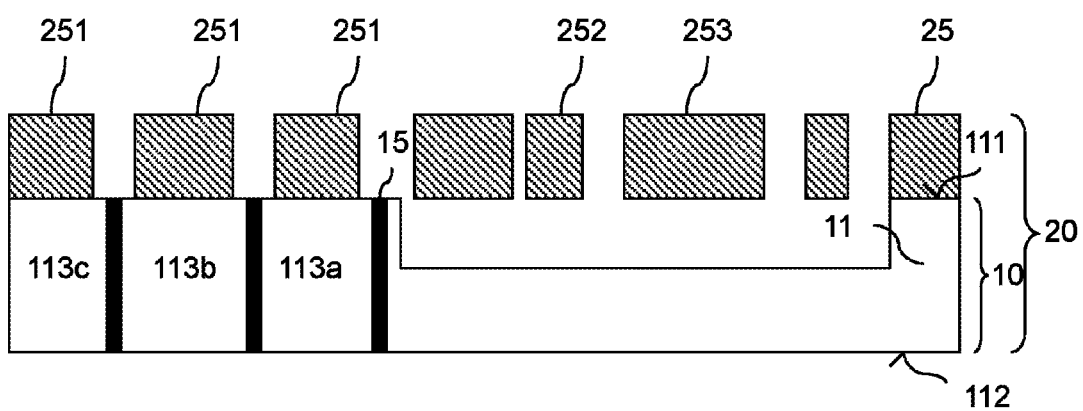

In a next process step, whose result is illustrated in FIG. 4C, the auxiliary layer 13 is removed. This can be conducted with the aid of a CMP process or an etching process. The auxiliary layer 13 is removed until the trenches 15 are reached. As a result, the trenches 13 adjoin the second surface 112 of the first substrate 11 and, thus, electrically insulate the regions 113a to 113c of the first substrate 11 from other regions of the first substrate 11.

Figure 4D:
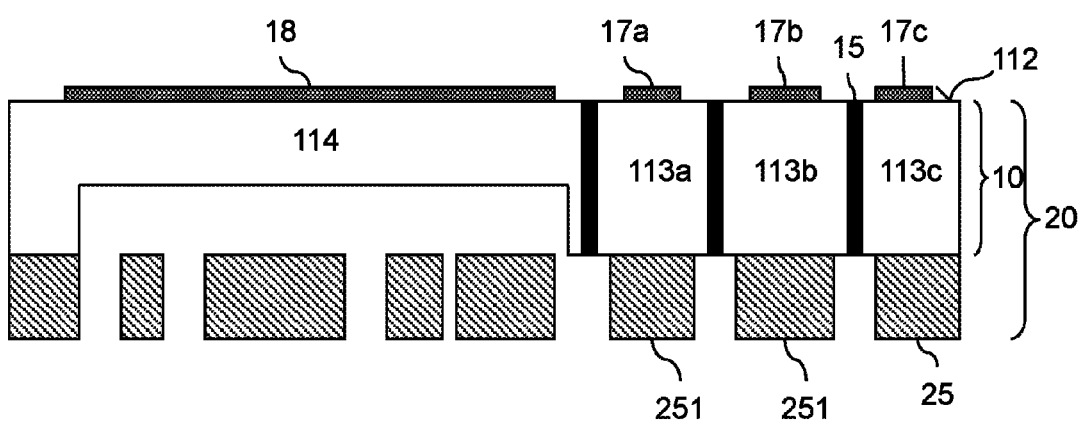

In a next process step, illustrated in FIG. 4D, first contact faces 17a to 17c and a second contact face 18 on the second surface 112 of the first substrate 11 are created. This process corresponds to the process step illustrated in FIG. 3C. As a result, the regions 251 can be contacted via the respective first regions 113a to 113c of the first substrate 11 and the associated respective first contact faces 17a to 17c, while the second contact face 18 forms a shielding electrode, which shields the active area of the component 1 from external electrical fields. Alternatively, also a plurality of contact faces 18 can be formed, in order to contact a plurality of second regions 114 of the first substrate 11 formed, if any, as illustrated in FIG. 3C.

Figure 5A:
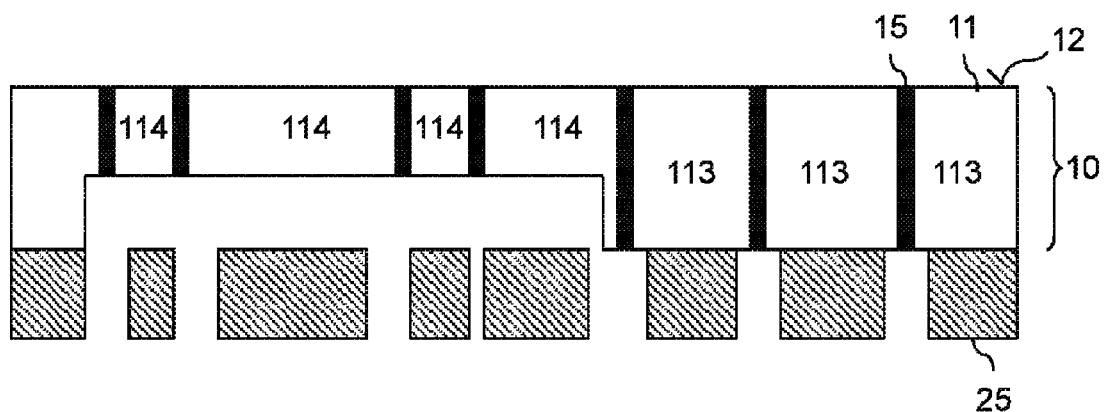
FIGS. 5A to 5C show steps of a third embodiment of the method according to the invention based on cross sections.
Figure 5B:
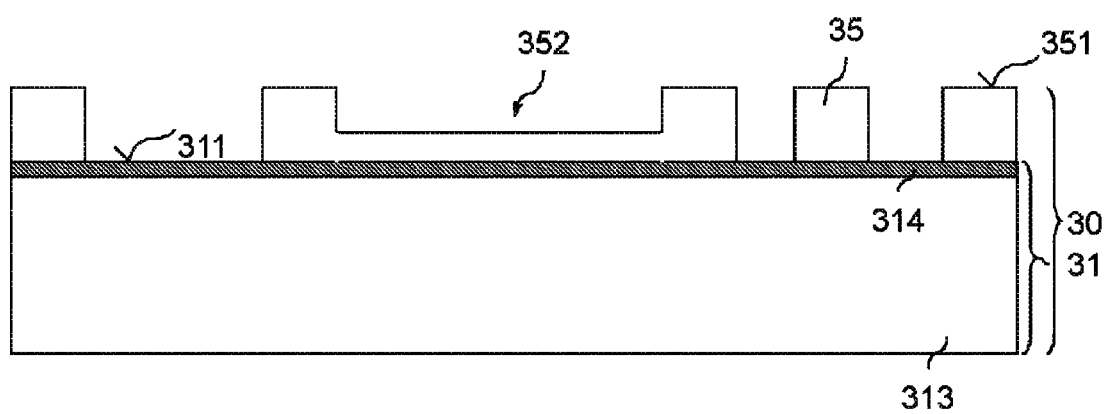
Figure 5C:
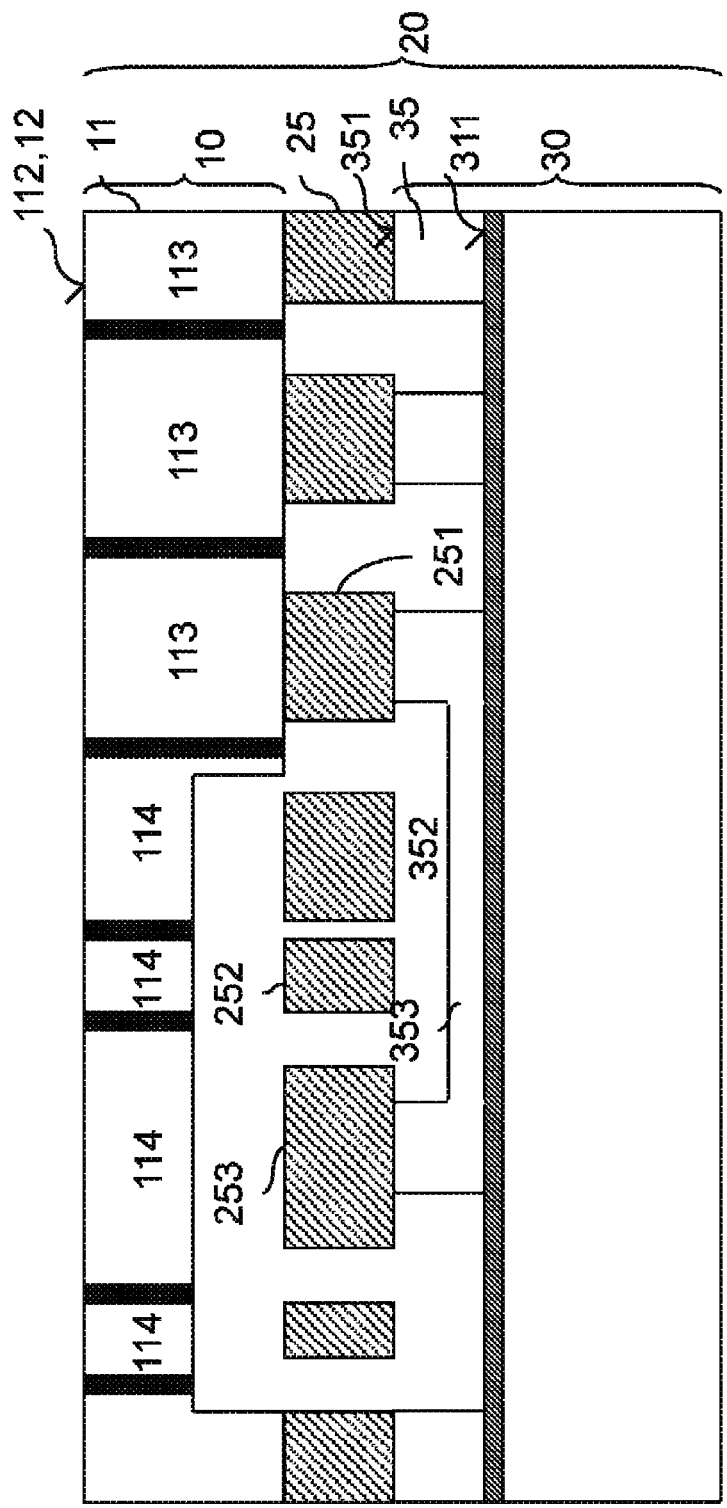

Based on FIGS. 5A to 5C, a third embodiment of the method for producing a component 1 according to the invention is explained.

Firstly, as illustrated in FIG. 5A, the first layer composite 10, which comprises the first substrate 11 and the at least one trench 15 filled with an insulating material, is connected to the structure layer 25, as this has been explained with reference to the FIGS. 3A and 3B. However, the first layer composite 10 can also be created according to the process steps illustrated in FIGS. 4A and 4B or 4A to 4C. This means, the first layer composite 10 can have, in addition to first regions 113, one second region 114 only. In addition, the first layer composite can be formed so that the trenches 15 extend to the first surface 12 of the first layer composite 10 after connecting the first layer composite 10 to the structure layer 25, as illustrated in FIG. 3B and in FIG. 4C, respectively. However, the trenches 15 also cannot yet extend to the first surface 12 of the first layer composite 10, which corresponds to the embodiment illustrated in FIG. 4B.

In a further process step, whose result is illustrated in FIG. 5B, a third layer composite 30 is created. The third layer composite 30 can be created independent of the process step illustrated in FIG. 5A, for example, chronologically before or after the process step illustrated in FIG. 5A. According to an embodiment, the third layer composite 30 comprises a third substrate 31 having a first layer 313 and a second layer 314 as well as a cover layer 35. The cover layer 35 is structured and forms guiding paths, which connect various regions of the cover layer 35 to each other. In doing so, also second depressions 352, which extend outwards from the first surface 351 of the cover layer 35, can be created. In this connection, the term "structuring" can comprise both the creation of electrically conductive regions, which are electrically insulated from each other, but not physically separated from each other, e.g. by doping a semiconductor layer, or the physical separation of electrically conductive regions from each other.

In a further process step, whose result is illustrated in FIG. 5C, a second layer composite 20 is created by connecting the structure layer 25 and the first layer composite 10 connected thereto to the third layer composite 30. This can be realized by a joining process, as described above. For this purpose, it is particularly advantageous that the structure layer 25 and the layer of the third layer composite 30 facing the structure layer 25, in this case, the cover layer 35, consist of the same material. This material can be silicon, for example. As a result, first regions 251 of the structure layer 25 adjoin the surface 351 of the cover layer 35. Thus, it is possible to produce conductive connections between electrically conductive regions of the structure layer 25 insulated from each other within the structure layer 25 within the cover layer 35. For example, the region of the cover layer adjoining the first depression 352 can form a conductor path bridge 353, which connects a first region 251 of the structure layer 25 to a second region 253 of the structure layer, bridging the active structure 252.

In case that the trench(es) 15 do not extend to the first surface 12 of the first layer composite 10 prior to the creation of the second layer composite 20, the first layer composite 10, after connecting the structure layer 25 and the first layer composite 10 to the third layer composite 30, is thinned from the first surface 12 to the extent that the trenches 15 adjoin the first surface 12 of the first layer composite 10. With other words: As a result, the second surface 112 of the first substrate 11 corresponds to the first surface 12 of the first layer composite 10.

In a further process step, first contact faces 17a to 17c, as well as a second contact face 18 or a plurality of second contact faces 18a to 18d, if any, are created on the second surface 112 of the first substrate 11, so that, as a result, the component 1 illustrated in FIG. 1A and FIG. 2, respectively is existent.

FIGS. 6A to 6D show process steps of a fourth embodiment of the method for producing a component according to the invention.

According to this embodiment, firstly a third layer composite 30 is [sic!], which comprises a third substrate 31 and a cover layer 35 conductive at least in one region. Thus, the third layer composite 30 illustrated in FIG. 6A corresponds to the third layer composite 30 illustrated in FIG. 5B.

In a further process step, the structure layer 25 is created on the first surface 351 of the cover layer 35, wherein the structure layer 25 can be applied to the surface 351 of the cover layer 35 as a layer, or can be connected to the surface 351 of the cover layer 35 by a joining process. The structure layer 25 can initially exist as an unstructured layer 25, which is subsequently structured, in order to create individual first regions 251, an active structure 252 and further regions, if any, for example, second regions 253. Alternatively, the structure layer 25 can already be applied, as a structured layer, to the surface 351 of the cover layer 35 or connected thereto. The result of this process step is illustrated in FIG. 6B.

Figure 6A:
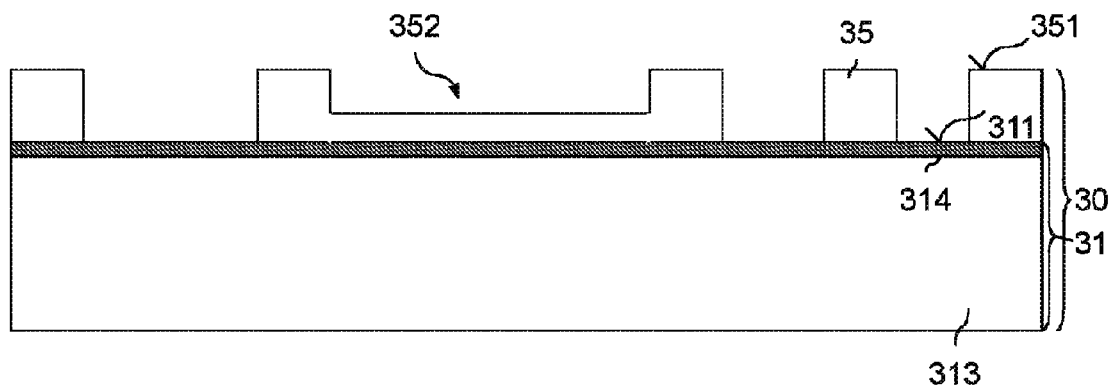
FIGS. 6A to 6D show steps of a fourth embodiment of the method according to the invention based on cross sections.
Figure 6B:
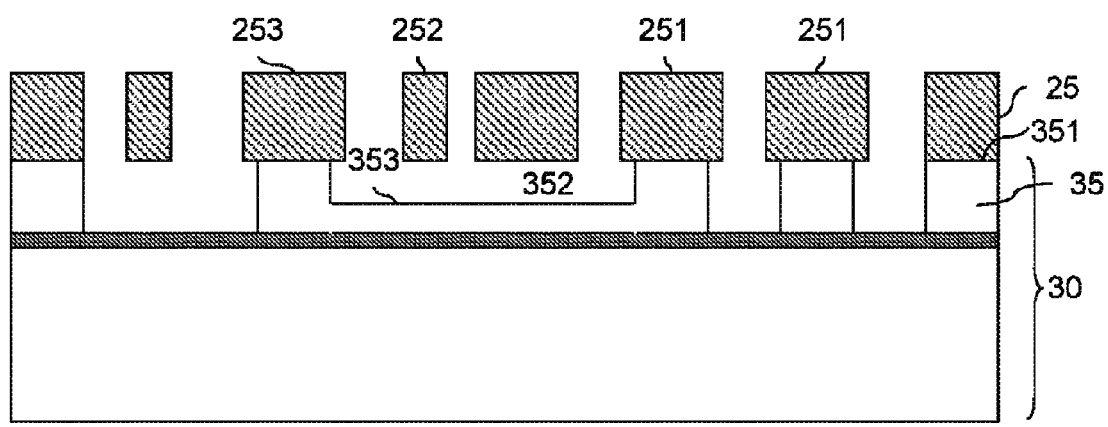
Figure 6C:
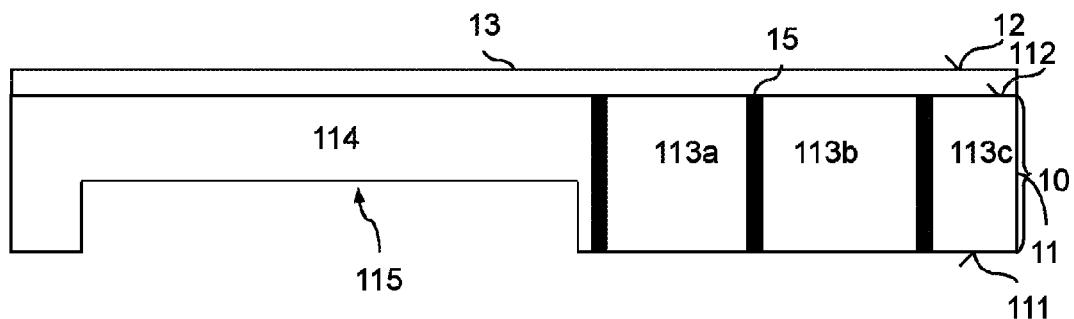

In a further process step, whose result is illustrated in FIG. 6C, a first layer composite 10 is created, which comprises a first substrate 11, at least one trench 15 filled with insulating material, and an auxiliary layer 13. The trench(es) 15 extend outwards from a first surface 111 of the first substrate 11 and laterally insulate first regions 113a to 113c of the first substrate 11 on the first surface 111 from other regions of the first substrate 11. Furthermore, one or more first depressions 115 can be formed in the first substrate 11, within which a second region 114 is arranged. Thus, the first layer composite 10 corresponds to the first layer composite 10 illustrated in FIG. 4A, with the statements on producing this first layer composite 10 applying as well.

The process step for creating the first layer composite 10 can be chronologically conducted prior to or after the process steps illustrated in FIGS. 6A and 6B.

Figure 6D:
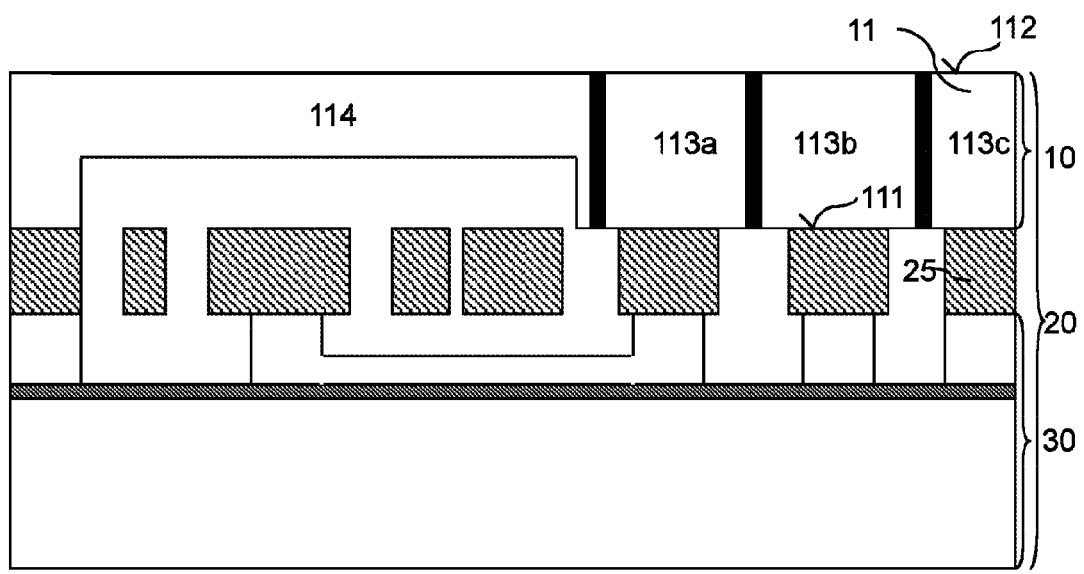

In a further process step, whose result is illustrated in FIG. 6D, a second layer composite 20 is created by connecting the first layer composite 10 to the structure layer 25 and to the third layer composite 30. As a result, the first surface 111 of the first substrate 11 adjoins the structure layer 25 at least in specific regions. The second layer composite 20 can, in particular, be created by a joining process. In this connection, the existence of the auxiliary layer 13 during the joining process is advantageous, as thereby particularly suited joining parameters, for example, high pressures, can be used, which result in a good and hermetically sealed connection between the first layer composite 10 and the structure layer 25. Subsequently to connecting the first layer composite 10 to the structure layer 25, the auxiliary layer 13 is removed, as explained with reference to FIG. 4C, so that, as a result, the second surface 112 of the first substrate 11 is freely accessible. The trenches 15 extend to the second surface 112, and thus electrically insulate the individual first regions 113a to 113c from other regions of the first substrate 11.

Alternatively, the cover layer 13 [sic!] can already be removed prior to connecting the first layer composite 10 to the structure layer 25.

In a further process step, first contact faces 17a to 17c as well as one or more second contact faces 18 are created on the surface 112 of the first substrate 11, as described with reference to the FIGS. 3C and 4D. As a result, a component 1 as illustrated in FIG. 1A and FIG. 2, respectively exists.

In addition to the embodiments illustrated in FIGS. 3A to 6D, further embodiments of the first layer composite 10, of the structure layer 25, of the third layer composite 30 and of the second layer composite 20 are possible as well as many different combinations of those embodiments. For example, second regions 114a to 114d can be formed in the first substrate 11 or not. The same applies to the first depression 115 in the first substrate 11. Also the cover layer 35 is not necessarily existent and structured in the form illustrated herein. The number of the first regions 113 of the first substrate 11 and of the second regions 114 of the first substrate 11 as well as of the first regions 251 of the structure layer 25 as well as of the first contact faces 17 and of the second contact faces 18 are freely selectable.

An advantage of the method for producing the component 1 is that the surface 112 of the first substrate 11 prior to creating the first contact faces 17 and the second contact faces 18, if any, is completely or nearly flat, i.e. has no or no major differences in height. This is notably advantageous for forming the first contact faces 17 and of the second contact face 18 as well as for subsequent process steps, for example, the singularization of the components 1 as well as the assembly of the component 1 onto a carrier, and the connection of the contact faces 17 and 18 to other elements. If a wire bonding process is used for contacting the contact faces 17 and 18 with other elements of a system, then the bonding process is simplified, since the contact face 17 or 18 to be contacted is not located in a narrow opening in a cover of the component. In addition, also other connecting processes, for example flip chip bonding or ball grid bonding, can be used to contact the contact faces 17 and 18 with other elements of a system. In addition, the space requirement for the contact faces 17 and 18 compared with a wire bonding connection, which is realized in a deep opening of the cover of the component, can be reduced by a factor of up to 100. Furthermore, the parasitic capacitance of a first contact surface 17 with respect to a second contact face 18, which serves as a shielding electrode, has about a forty times smaller size, given the same dielectric constant.

Furthermore, the tightness of the hermetic encapsulation of the active area of the component 1 can be ensured. In particular, suited joining parameters can be selected during the joining process to connect the structure layer 25 to the first layer composite 10 or the structure layer 25 already applied to the first layer composite 10 to the third layer composite 30.

What is claimed is:

1. A method for producing a component, comprising:
    the step of creating a first layer composite, which comprises a first substrate made of an electrically conductive material and at least one trench filled with an insulating material, which extends outwards from a first surface of the first substrate, wherein a first region of the first substrate is electrically insulated laterally from other regions of the first substrate by the at least one trench on the first surface,
    the step of creating a second layer composite, which comprises the first layer composite and a structure layer, which comprises an active structure of the component and which is electrically conductive at least in a first region, wherein the first region of the structure layer adjoins the first surface of the first substrate in the first region of the first substrate, and is connected thereto in an electrically conductive manner, and
    the step of creating a first electrically conductive contact face on a second surface of the first substrate, wherein the second surface is located opposite the first surface, and wherein the first contact face is arranged in the first region of the first substrate, wherein the first region of the first substrate is electrically insulated laterally from other regions of the first substrate by the at least one trench on the second surface.

2. The method for producing a component according to claim 1,
    characterized in that
    during the step of creating the first layer composite, a first depression is created in the first surface of the first substrate, wherein the first depression has a depth smaller than the thickness of the first substrate, and wherein the first region of the first substrate is located outside of the first depression, and a second region of the first substrate is arranged within the first depression, wherein the second region of the first substrate is electrically insulated laterally from other regions of the first substrate by the at least one trench on the first surface of the first substrate, during the step of creating the second layer composite, at least a part of the active structure is arranged within the first depression at a distance to the first substrate, and a second electrically conductive contact face is created on the second surface of the first substrate, wherein the second contact face is arranged in the second region of the first substrate, and wherein the second region of the first substrate is electrically insulated laterally from other regions of the first substrate by the at least one trench on the second surface.

3. The method for producing a component according to claim 2,
characterized in that
the first layer composite comprises at least two trenches filled with insulating material,
at least two second regions of the first substrate are arranged within the first depression, and
at least two second contact faces are created on the second surface of the first substrate, wherein every second contact face is arranged in one of the second regions of the first substrate.

4. The method for producing a component according to claim 1,
characterized in that
the first layer composite only comprises the first substrate and the at least one trench, and
the at least one trench in the first substrate extends to the second surface of the first substrate prior to creating the second layer composite.

5. The method for producing a component according to claim 1,
characterized in that
the at least one trench in the first layer composite extends to a depth, which is smaller than the thickness of the first layer composite, prior to the step of creating the second layer composite, and,
prior to the step of creating the first contact face, the thickness of the first layer composite from a first surface of the first layer composite to the depth of the at least one trench is reduced, wherein the first surface of the first layer composite is the surface of the first layer composite, which is located opposite the first surface of the first substrate.

6. The method for producing a component according to claim 1,
characterized in that
the second layer composite further comprises a third layer composite adjoining the substrate layer on the side opposite the first layer composite and comprising a second substrate.

7. The method for producing a component according to claim 6,
characterized in that
the step of creating the second layer composite comprises:
the step of creating the structure layer on the first surface of the first substrate, and
the step of connecting the structure layer applied to the first layer composite to the third layer composite.

8. The method for producing a component according to claim 6,
characterized in that
the step of creating the second layer composite comprises:
the step of creating the structure layer on the third layer composite, and
the step of connecting the structure layer applied to the third layer composite to the first layer composite.

9. The method for producing a component according to claim 6,
characterized in that
the third layer composite comprises a cover layer conductive at least in a region, wherein the cover layer is arranged on a first surface of the second substrate, wherein the first surface of the second substrate is the surface of the second substrate facing the structure layer,
a second depression is created in a first surface of the cover layer, wherein the first surface of the cover layer is the surface of the cover layer facing the structure layer, and wherein the depth of the second depression is smaller than the thickness of the cover layer, and
during the step of creating the second layer composite, the conductive region of the cover layer adjoins the first region of the structure layer and a second region of the structure layer, wherein the first region of the structure layer is arranged outside of the active structure, and the second region of the structure layer is arranged within the active structure and is electrically conductive, and the second depression and at least one part of the active structure are arranged such that the lateral position of the second depression corresponds to the lateral position of the at least one part of the active structure, wherein the cover layer forms a conductor path bridge, which connects the second region of the structure layer to the first region of the structure layer.

10. The method for producing a component according to claim 6,
characterized in that
the structure layer and the layer of the third layer composite facing the structure layer consist of the same material.

11. The method for producing a component according to claim 1,
characterized in that
the first substrate and the structure layer consist of the same material.

12. A component comprising:
a first layer composite, which comprises a first substrate made of an electrically conductive material and at least one trench filled with an insulating material, which extends outwards from a first surface of the first substrate to a second surface of the first substrate, wherein the second surface is located opposite the first surface, and wherein a first region of the first substrate is electrically insulated laterally from other regions of the first substrate by the at least one trench,
a structure layer, which comprises an active structure of the component and which is electrically conductive at least in a first region, wherein the first region of the structure layer adjoins the first surface of the first substrate in the first region of the first substrate, and is connected to the first region of the first substrate in an electrically conductive manner, and an electrically conductive contact face is arranged on the second surface of the first substrate, wherein the first contact face is arranged in the first region of the first substrate.

13. The component according to claim 12, characterized in that
    a first depression is formed in the first surface of the first substrate, wherein the first depression has a depth smaller than the thickness of the first substrate, and wherein the first region of the first substrate is arranged outside of the first depression, and a second region of the first substrate is arranged within the first depression, wherein the second region of the first substrate is electrically insulated laterally from other regions of the first substrate by the at least one trench,
    at least a part of the active structure is arranged within the first depression at a distance to the first substrate, and
    a second electrically conductive contact face is arranged on the second surface of the first substrate, wherein the second contact face is arranged in the second region of the first substrate.

14. The component according to claim 13, characterized in that
    the first layer composite comprises at least two trenches filled with insulating material,
    at least two second regions of the first substrate are arranged within the first depression, and
    at least two second contact faces are arranged on the second surface of the first substrate, wherein every second contact face is arranged in one of the second regions of the first substrate.

15. The component according to claim 12, characterized in that
    the component further comprises a third layer composite adjoining the substrate layer on the side opposite the first layer composite and comprising a second substrate.

16. The component according to claim 15, characterized in that
    the third layer composite comprises a cover layer conductive at least in a region, wherein the cover layer is arranged on a first surface of the second substrate, wherein the first surface of the second substrate is the surface of the second substrate facing the structure layer,
    a second depression is formed in a first surface of the cover layer, wherein the first surface of the cover layer is the surface of the cover layer facing the structure layer, and wherein the depth of the second depression is smaller than the thickness of the cover layer, and
    the conductive region of the cover layer adjoins the first region of the structure layer and a second region of the structure layer, wherein the first region of the structure layer is arranged outside of the active structure, and the second region of the structure layer is arranged within the active structure and is electrically conductive, and the second depression and at least one part of the active structure are arranged such that the lateral position of the second depression corresponds to the lateral position of the at least one part of the active structure, wherein the cover layer forms a conductor path bridge, which connects the second region of the structure layer to the first region of the structure layer.

17. The component according to claim 15, characterized in that
    the structure layer and the layer of the third layer composite facing the structure layer consist of the same material.

18. The component according to claim 12, characterized in that
    the first substrate and the structure layer consist of the same material.

* * * * *